(12) United States Patent
Vengateswaran et al.

(10) Patent No.: US 12,604,533 B2
(45) Date of Patent: Apr. 14, 2026

(54) ADAPTABLE ELECTROSTATIC DISCHARGE CLAMP TRIGGER CIRCUIT

(71) Applicant: Sandisk Technologies, Inc., Milpitas, CA (US)

(72) Inventors: Aravinth Vengateswaran, Bangalore (IN); Ajay Kanth Chitturi, Bangalore (IN); Muralikrishna Balaga, Bangalore (IN)

(73) Assignee: Sandisk Technologies, Inc., Milpitas, CA (US)

( * ) Notice: Subject to any disclaimer, the term of this patent is extended or adjusted under 35 U.S.C. 154(b) by 153 days.

(21) Appl. No.: 18/391,792

(22) Filed: Dec. 21, 2023

(65) Prior Publication Data

US 2025/0212527 A1    Jun. 26, 2025

(51) Int. Cl.
*H10D 89/60* (2025.01)
(52) U.S. Cl.
CPC ................................. *H10D 89/811* (2025.01)
(58) Field of Classification Search
CPC ..................................................... H10D 89/811
See application file for complete search history.

(56) References Cited

U.S. PATENT DOCUMENTS 6,069,782 A * 5/2000 Lien ........................ H10D 89/60
361/111
6,433,609 B1 * 8/2002 Voldman ................... H03K 5/08
327/328

6,690,561 B2 * 2/2004 Hung ...................... H02H 9/046
361/111
6,919,602 B2 * 7/2005 Lin ........................ H10D 89/811
361/111
7,742,265 B2 * 6/2010 Rice ...................... H10D 89/811
361/56
8,068,319 B1 11/2011 Chan
9,172,241 B2 * 10/2015 Chen ...................... H02H 9/046
10,770,892 B2 9/2020 Loiseau et al.
11,128,117 B2 9/2021 Takahashi et al.
2009/0059440 A1 * 3/2009 Moe ........................ G11B 27/36
360/323
2017/0155243 A1 6/2017 Tan et al.

FOREIGN PATENT DOCUMENTS

TW 201135900 A 10/2011

* cited by examiner

*Primary Examiner* — Thienvu V Tran
*Assistant Examiner* — Muaamar Qahtan Al-Taweel
(74) *Attorney, Agent, or Firm* — Pearl Cohen Zedek Latzer Baratz LLP

(57)    ABSTRACT

An apparatus includes one or more circuits configured to control an Electrostatic Discharge (ESD) clamp device. The one or more circuits include a Resistor-Capacitor (RC) delay portion, a pull-up device, a pull-down device and a discharge pathway. The RC delay portion is configured to control the pull-up device. The pull-up device is connected to a control node of the pull-down device to control the pull-down device. The pull-down device is configured to control the ESD clamp device. The discharge pathway is connected to the control node of the pull-down device to discharge the control node in non-ESD conditions.

20 Claims, 14 Drawing Sheets

1002 when the supply voltage is in a non-ESD range, sinking a first current through one or more depletion-mode Metal Oxide Semiconductor (MOS) devices connected to the second terminal of the pull-up device such that the first current is substantially equal to current through the pull-up device and the voltage of the control terminal of the pull-down device is substantially stable;

1004 when the supply voltage is in an ESD range, sinking a second current through the one or more depletion-mode MOS devices such that the second current is less than the current through the pull-up device and the voltage of the control terminal of the pull-down device increases.

ADAPTABLE ELECTROSTATIC DISCHARGE CLAMP TRIGGER CIRCUIT

BACKGROUND

The present technology relates to Integrated Circuit (IC) dies including dies used in memory systems and to protecting such dies from Electrostatic Discharge.

Semiconductor memory devices have become more popular for use in various electronic devices. For example, non-volatile semiconductor memory is used in cellular telephones, digital cameras, personal digital assistants, mobile computing devices, non-mobile computing devices and other devices (host devices).

A memory device includes memory cells, which may be arranged in series, in NAND strings, for instance, where select gate transistors are provided at the ends of the NAND string to selectively connect a channel of the NAND string to a source line or bit line.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A high voltage may occur between conductors of a die, for example, due to discharge of static charge (Electrostatic Discharge or "ESD") that builds up on an object (e.g., a human body). If such a high voltage is not rapidly discharged in a safe manner, it may discharge through die circuits, which may damage the circuits and lead to die failure. ESD protection may be provided to ensure safe discharge and avoid damage.

BRIEF DESCRIPTION OF THE DRAWINGS

Like-numbered elements refer to common components in the different Figures.

FIG. 1C is a block diagram of one embodiment of a Back End Processor Circuit. In some embodiments, the Back End Processor Circuit is part of a Controller.

FIG. 9 shows an example implementation of an ESD clamp control circuit that includes a first stage and a second stage.

FIG. 10 shows an example of a method that includes sinking a current through one or more depletion-mode MOS devices.

DETAILED DESCRIPTION

Circuits and techniques are disclosed herein to protect circuits from Electrostatic Discharge (ESD) in an efficient manner. An ESD clamp device may extend between terminals to provide a low-impedance pathway to discharge a high voltage occurring during an ESD event. The ESD clamp device may be controlled by an ESD clamp control circuit (trigger circuit) that turns the ESD clamp device on (makes it conductive) when an ESD even occurs (e.g., when voltage between terminals exceeds a limit).

The present technology includes ESD clamp control circuits that can operate efficiently with a wide range of supply voltages. For example, an ESD clamp control circuit may operate with lower supply voltages used to facilitate higher interface speeds and also operate with higher supply voltages associated with lower interface speeds without excessive leakage currents. This may allow the same ESD clamp control circuit to be used with different voltage inputs (e.g., different voltage inputs on the same die and/or different voltage inputs on different dies). Examples of the present technology include using discharge pathways connected to control nodes of ESD clamp control circuits, with the discharge pathways having limited capacity to sink current. For example, a discharge pathway may sink current flowing into a control node during non-ESD operation so that the voltage of the control node stays at a safe level (e.g., below a level that could trigger an ESD clamp device. Under ESD conditions, the discharge pathway may sink significantly less than all current flowing into a control node so that the voltage of the control node rises, which may cause the ESD clamp control circuit to trigger (turn on, or make conductive) an ESD clamp device.

Aspects of the present technology provide solutions to technical problems of compatibility of ESD clamp control devices with different input voltages that may be provided to a system (e.g., a data storage system). Technical solutions provided by examples of the present technology allow an ESD clamp control device to operate with a range of different supply voltages in an efficient manner.

Figure 1A:
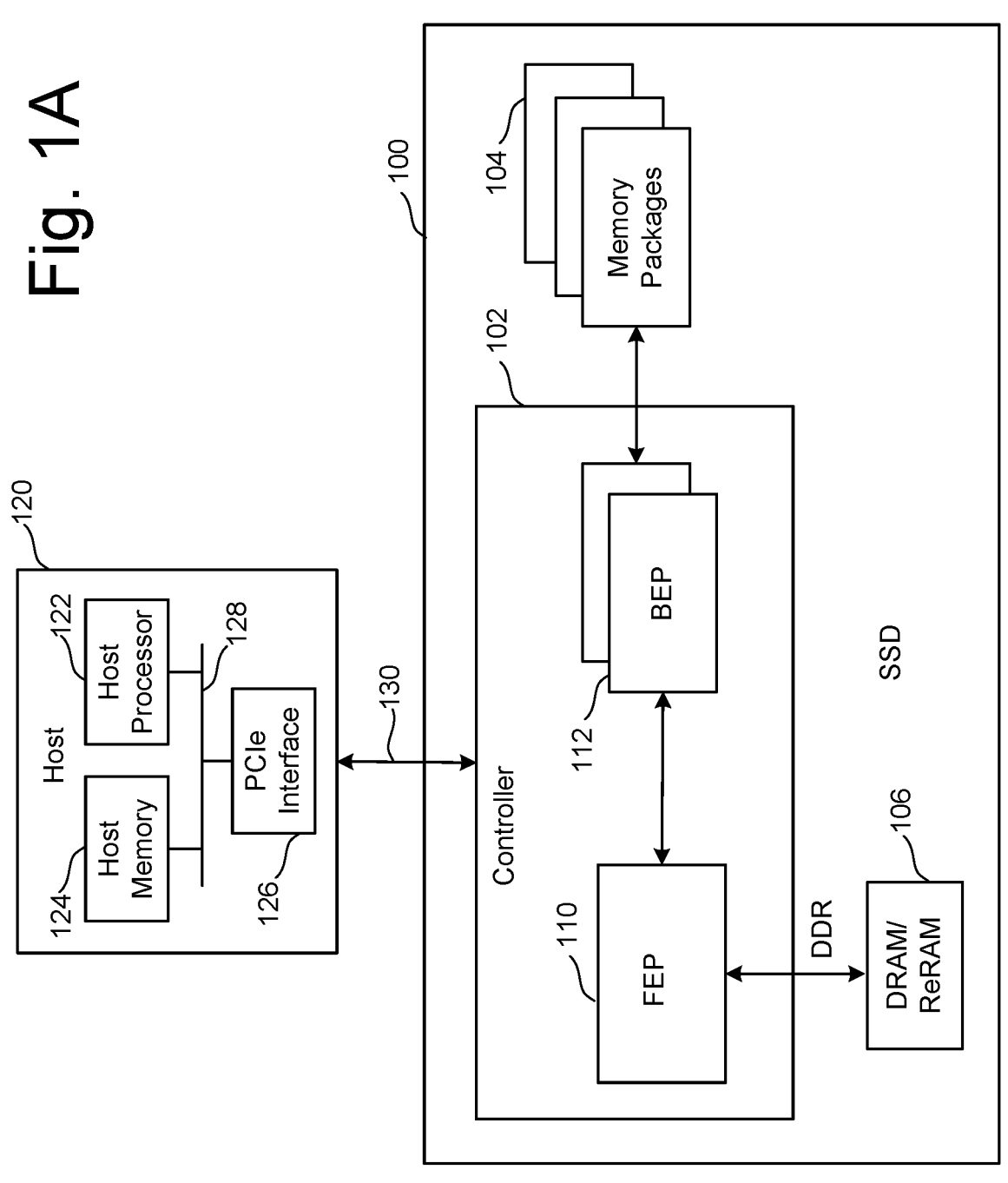
FIG. 1A is a block diagram of one embodiment of a memory system connected to a host.

FIG. 1A is a block diagram of one embodiment of a memory system 100 (data storage system) connected to a host 120. Memory system 100 can be configured to implement aspects of the technology proposed herein. Many different types of memory systems can be used with the technology proposed herein. One example memory system is a solid-state drive ("SSD"); another is a memory card; however, other types of memory systems can also be used. Memory system 100 comprises a Controller 102, nonvolatile memory 104 for storing data, and local memory (e.g., DRAM/ReRAM) 106. Controller 102 comprises a Front-End Processor Circuit (FEP) 110 and one or more Back End Processor Circuits (BEP) 112. In one embodiment FEP circuit 110 is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP 110 and BEP 112 both include their own processors. In one embodiment, FEP circuit 110 and BEP 112 work as a master slave configuration where the FEP circuit 110 is the master, and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other nonvolatile data storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, nonvolatile memory 104 comprises a plurality of memory packages. Each memory package includes one or more memory die. Therefore, Controller 102 is connected to one or more nonvolatile memory die. In one embodiment, each memory die in the memory packages 14 utilizes NAND flash memory (including two-dimensional NAND flash memory and/or three-dimensional NAND flash memory). In other embodiments, the memory package can include other types of memory.

Controller 102 communicates with host 120 via an interface 130. For example, interface 130 may be configured according to a standard such as the Secure Digital (SD) standard and/or the Non Volatile Memory express (NVMe) standard (e.g., using PCI Express (PCIe)). For working with memory system 100, host 120 includes a host processor 122, host memory 124, and in this example a PCIe interface 126 connected to bus 128. Host memory 124 is the host's physical memory, and can be DRAM, SRAM, nonvolatile memory or another type of storage. Host 120 is external to and separate from memory system 100. In one embodiment, memory system 100 is embedded in host 120.

Figure 1B:
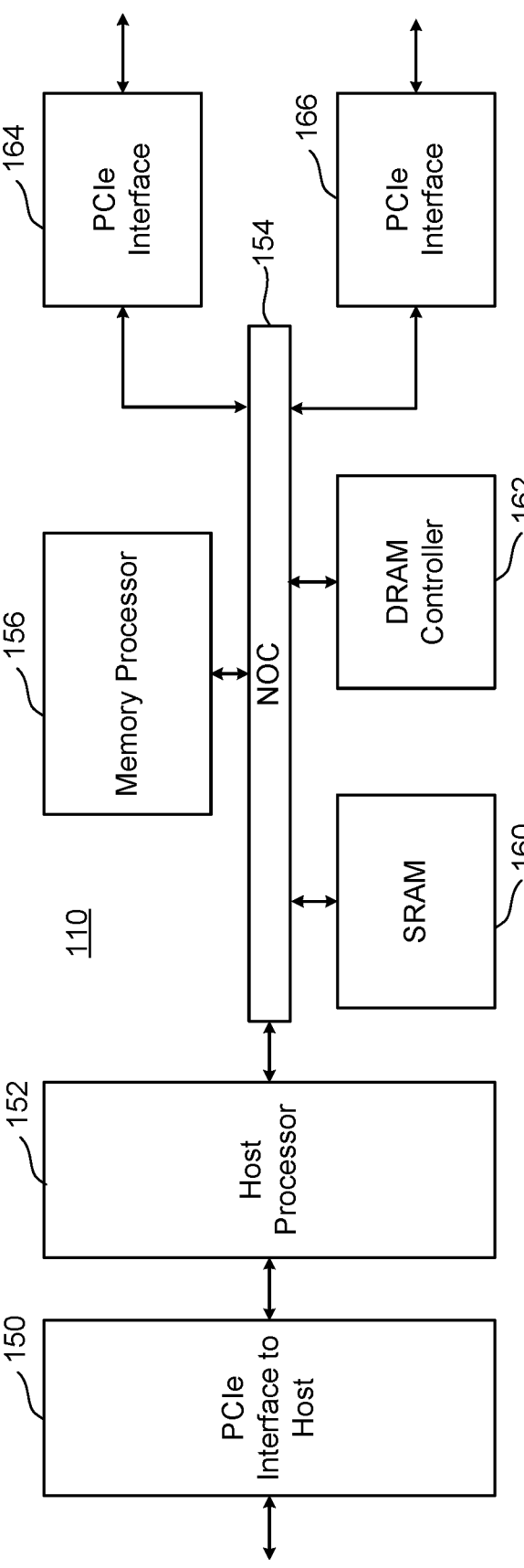
FIG. 1B is a block diagram of one embodiment of a Front-End Processor Circuit. In some embodiments, the Front-End Processor Circuit is part of a Controller.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 1C:
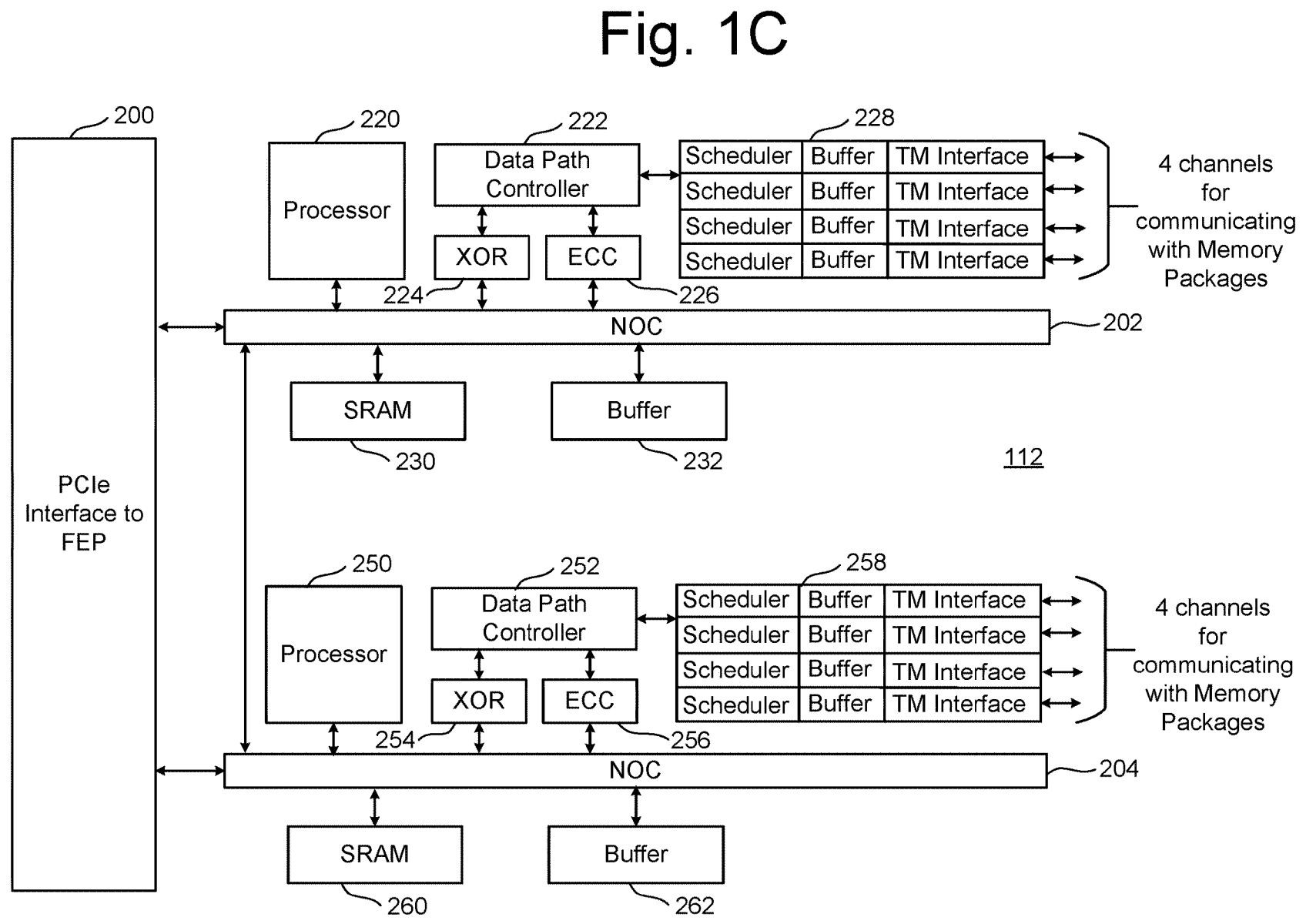

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 22 is connected to an interface module for communicating via four channels with memory packages. Thus, the top NOC 202 is associated with an interface 228 for four channels for communicating with memory packages. Top NOC 202 and connected components including interface 228, processor 220, data path controller 222, XOR engine 224, ECC engine 226, SRAM 230 and Buffer 232 may be considered an example of a Flash Interface Module (FIM). Bottom NOC 204 is associated with an interface 258 for four additional channels for communicating with memory packages. Bottom NOC 204 and connected components including interface 258, processor 250, data path controller 252, XOR engine 254, ECC engine 256, SRAM 260 and Buffer 262 may be considered another example of a FIM. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. Each FIM has one XOR engine and one ECC engine to allow independent data correction and/or recovery. In other embodiments, the XOR engines 224/254 and ECC engines 226/256 can be implemented in software. The scheduler, buffer, and TM Interfaces are hardware circuits.

Figure 1D:
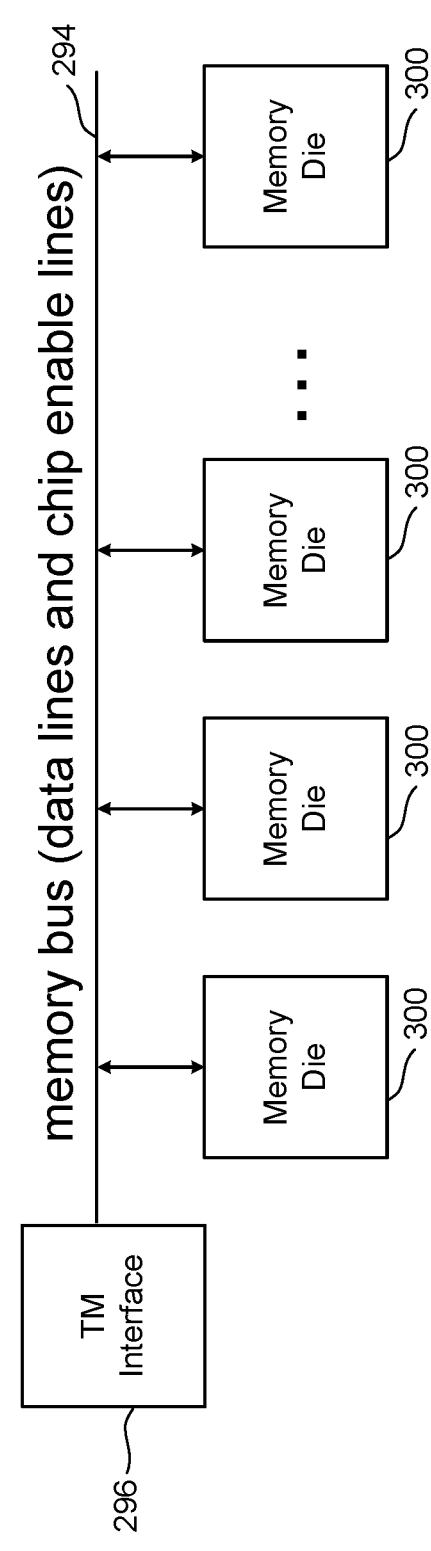
FIG. 1D is a block diagram of one embodiment of a memory package.

FIG. 1D is a block diagram of one embodiment of a memory package 104 that includes a plurality of memory die 300 connected to a memory bus 294 (data lines and chip enable lines). The memory bus 294 connects to a Toggle Mode Interface 296 for communicating with the TM Interface of a BEP circuit 112 (see e.g., FIG. 1C). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 2A:
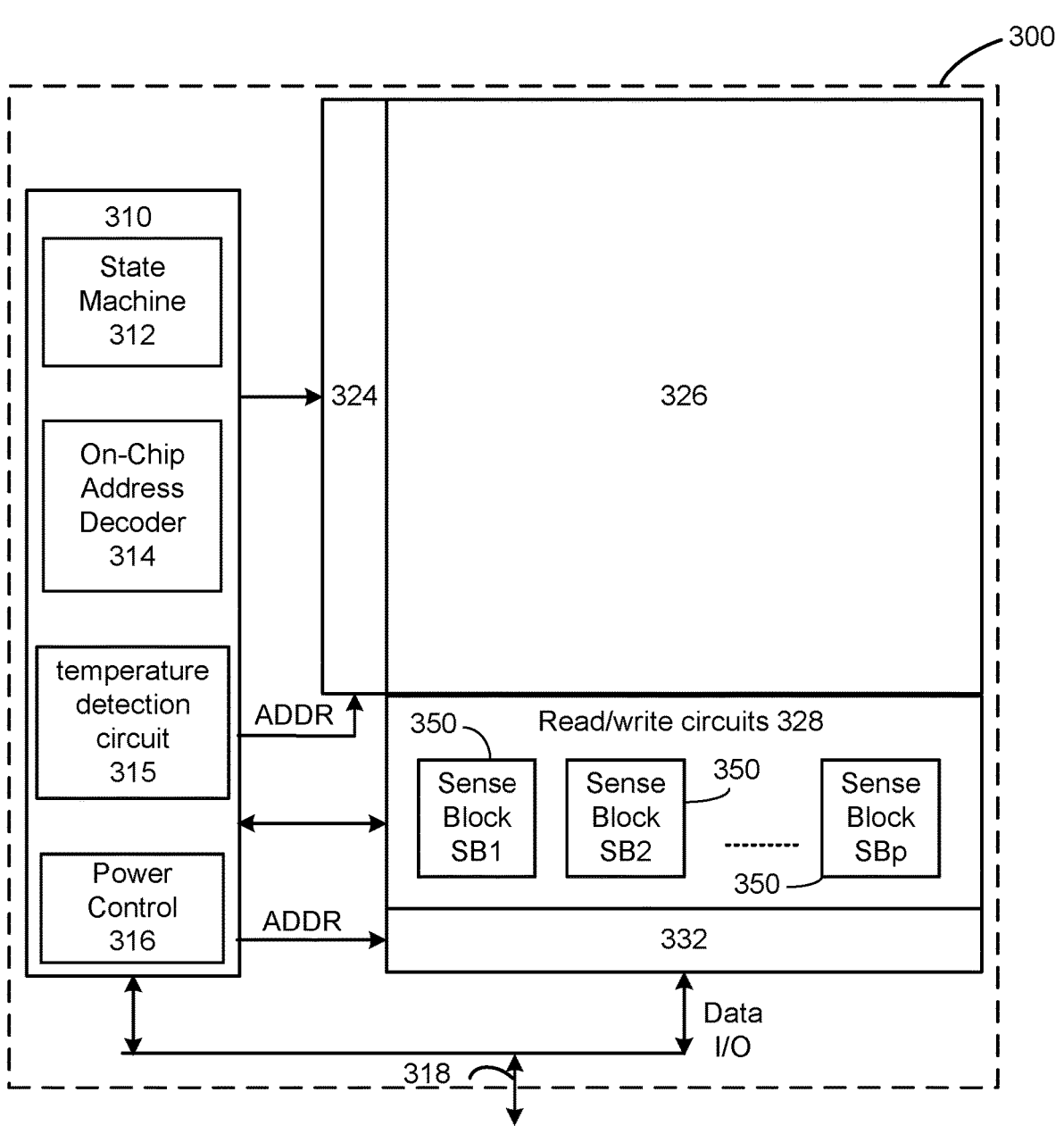
FIG. 2A is a functional block diagram of an embodiment of a memory die.

FIG. 2A is a functional block diagram of one embodiment of a memory die 300. Each of the one or more memory die 300 of FIG. 1D can be implemented as memory die 300 of FIG. 2A. The components depicted in FIG. 2A are electrical circuits. In one embodiment, each memory die 300 includes a memory structure 326, control circuits 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuits) and allow a page (or multiple pages) of data in multiple memory cells to be read or programmed in parallel. In one embodiment, each sense block includes a sense amplifier and a set of latches connected to the bit line. The latches store data to be written and/or data that has been read. The sense blocks include bit line drivers.

Commands and data are transferred between the controller and the memory die 300 via lines 318, which may form a bus between memory die 300 and the controller (e.g., memory bus 294). In one embodiment, memory die 300 includes a set of input and/or output (I/O) pins that connect to lines 318.

Control circuits 310 cooperate with the read/write circuits 328 to perform memory operations (e.g., write, read, erase, and others) on memory structure 326. In one embodiment, control circuits 310 includes a state machine 312, an on-chip address decoder 314, a power control module 316 (power control circuit) and a temperature detection circuit 315. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuits 310 include buffers such as registers, ROM fuses and other storage devices for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

For purposes of this document, control circuits 310, alone or in combination with read/write circuits 328 and decoders 324/332, comprise one or more control circuits for memory structure 326. These one or more control circuits are electrical circuits that perform the functions described below in the flow charts and signal diagrams. In other embodiments, the one or more control circuits can consist only of controller 102, which is an electrical circuit in combination with software, that performs the functions described below in the flow charts and signal diagrams. In another alternative, the one or more control circuits comprise controller 102 and control circuits 310 performing the functions described below in the flow charts and signal diagrams. In another embodiment, the one or more control circuits comprise state machine 312 (or a microcontroller or microprocessor) alone or in combination with controller 102.

In one embodiment, memory structure 326 comprises a monolithic three-dimensional memory array of nonvolatile memory cells in which multiple memory levels are formed above a single substrate, such as a wafer. The memory structure may comprise any type of nonvolatile memory that is monolithically formed in one or more physical levels of arrays of memory cells having an active area disposed above a silicon (or other type of) substrate. In one example, the nonvolatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two-dimensional memory array of nonvolatile memory cells. In one example, the nonvolatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

In one embodiment, the control circuit(s) (e.g., control circuits 310) are formed on a first die, referred to as a control die, and the memory array (e.g., memory structure 326) is formed on a second die, referred to as a memory die. For example, some or all control circuits (e.g., control circuit 310, row decoder 324, column decoder 332, and read/write circuits 328) associated with a memory may be formed on the same control die. A control die may be bonded to one or more corresponding memory die to form an integrated memory assembly. The control die and the memory die may have bond pads arranged for electrical connection to each other. Bond pads of the control die and the memory die may be aligned and bonded together by any of a variety of bonding techniques, depending in part on bond pad size and bond pad spacing (i.e., bond pad pitch). In some embodiments, the bond pads are bonded directly to each other, without solder or other added material, in a so-called Cu-to-Cu bonding process. In some examples, dies are bonded in a one-to-one arrangement (e.g., one control die to one memory die). In some examples, there may be more than one control die and/or more than one memory die in an integrated memory assembly. In some embodiments, an integrated memory assembly includes a stack of multiple control die and/or multiple memory die. In some embodiments, the control die is connected to, or otherwise in communication with, a memory controller. For example, a memory controller may receive data to be programmed into a memory array. The memory controller will forward that data to the control die so that the control die can program that data into the memory array on the memory die.

Figure 2B:
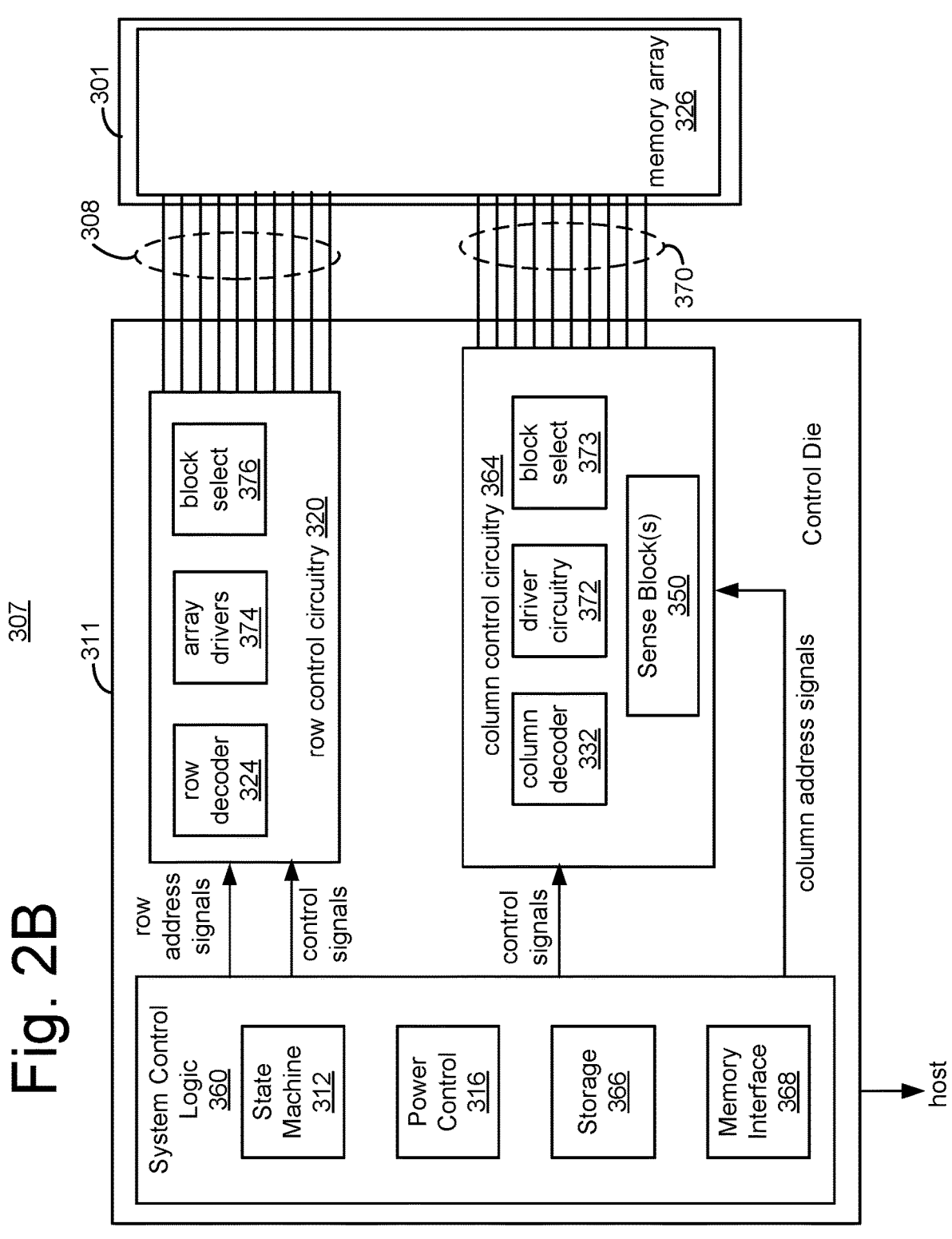
FIG. 2B is a functional block diagram of an embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 307. One or more integrated memory assemblies 307 may be used in a memory package 104 in memory system 100. The integrated memory assembly 307 includes two types of semiconductor die (or more succinctly, "die"). Memory die 301 includes memory array 326 (memory structure). Memory array 326 may contain nonvolatile memory cells.

Control die 311 includes column control circuitry 364, row control circuitry 320 and system control logic 360 (including state machine 312, power control module 316, storage 366, and memory interface 368). In some embodiments, control die 311 is configured to connect to the memory array 326 in the memory die 301. FIG. 2B shows an example of the peripheral circuitry, including control circuits, formed in a peripheral circuit or control die 311 coupled to memory array 326 formed in memory die 301. System control logic 360, row control circuitry 320, and column control circuitry 364 are located in control die 311. In some embodiments, all or a portion of the column control circuitry 364 and all or a portion of the row control circuitry 320 are located on the memory die 301. In some embodiments, some of the circuitry in the system control logic 360 is located on the on the memory die 301.

System control logic 360, row control circuitry 320, and column control circuitry 364 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 364). Thus, while moving such circuits from a die such as memory die 301 may reduce the number of steps needed to fabricate such a die, adding such circuits to a die such as control die 311 may not require many additional process steps.

FIG. 2B shows column control circuitry 364 including sense block(s) 350 on the control die 311 coupled to memory array 326 on the memory die 301 through electrical paths 370. For example, electrical paths 370 may provide electrical connection between column decoder 332, driver circuitry 372, and block select 373 and bit lines of memory array (or memory structure) 326. Electrical paths may extend from column control circuitry 364 in control die 311 through pads on control die 311 that are bonded to corresponding pads of the memory die 301, which are connected to bit lines of memory structure 326. Each bit line of memory structure 326 may have a corresponding electrical path in electrical paths 370, including a pair of bond pads, which connects to column control circuitry 364. Similarly, row control circuitry 320, including row decoder 324, array drivers 374, and block select 376 are coupled to memory array 326 through electrical paths 308. Each of electrical paths 308 may correspond to a word line, dummy word line, or select gate line. Additional electrical paths may also be provided between control die 311 and memory structure die 301.

In some embodiments, there is more than one control die 311 and/or more than one memory die 301 in an integrated memory assembly 307. In some embodiments, the integrated memory assembly 307 includes a stack of multiple control die 311 and multiple memory structure die 301. In some embodiments, each control die 311 is affixed (e.g., bonded) to at least one of the memory structure dies 301.

The exact type of memory array architecture or memory cell included in memory structure 326 is not limited to the examples above. Many different types of memory array architectures or memory cell technologies can be used to form memory structure 326. No particular nonvolatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
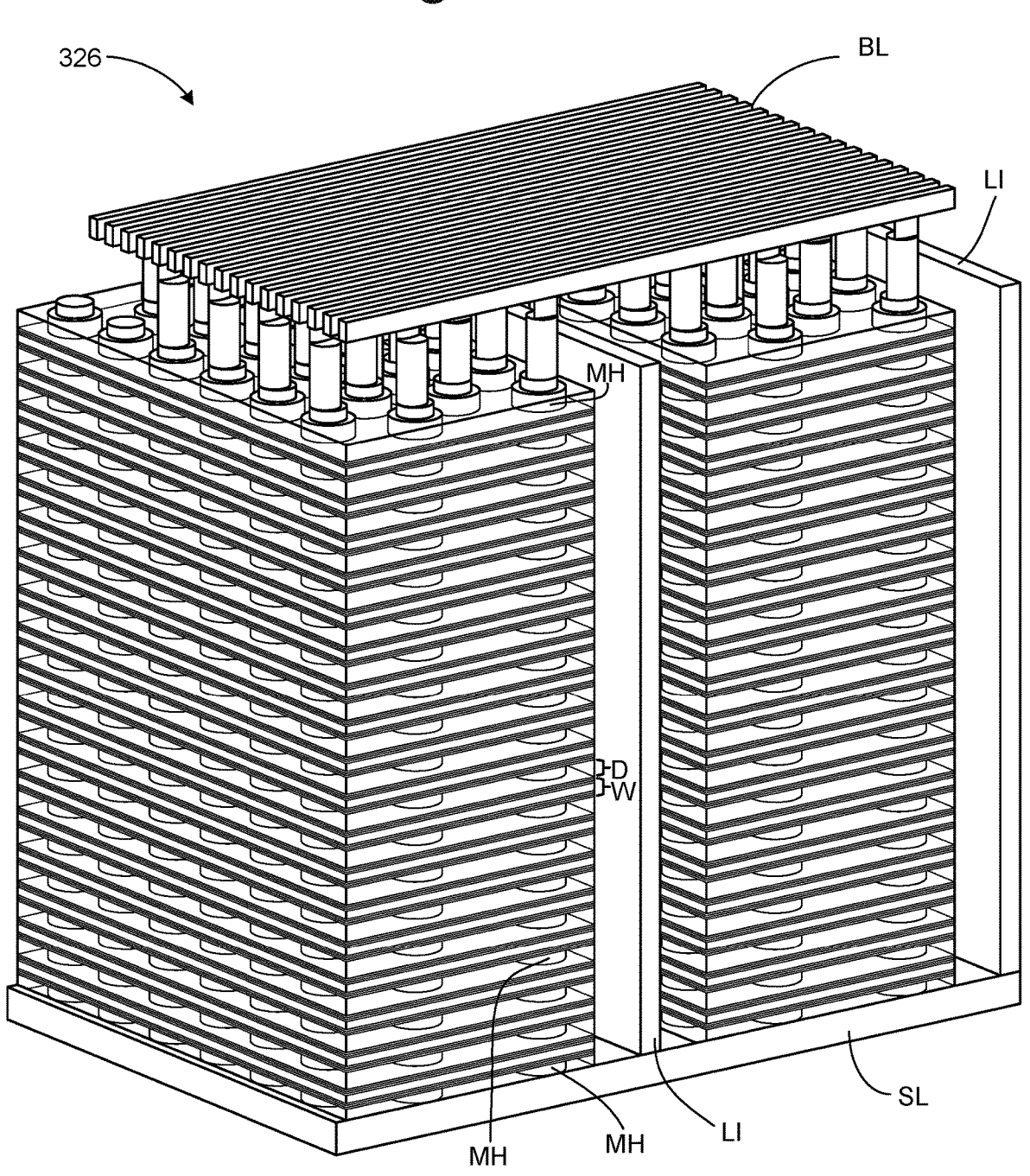
FIG. 3 is a perspective view of a portion of one embodiment of a monolithic three-dimensional memory structure.

FIG. 3 is a perspective view of a portion of one example embodiment of a monolithic three-dimensional memory array that can comprise memory structure 326, which includes a plurality memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-278 alternating dielectric layers and conductive layers, for example, 127 data word line layers, 8 select layers, 4 dummy word line layers and 139 dielectric layers.

More or fewer than 108-278 layers can also be used. As will be explained below, the alternating dielectric layers and conductive layers are divided into four "fingers" or "strings"

by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data.

In many electronic systems, including memory systems such as those described with respect to FIGS. 1A-3, ESD events may damage circuit components and may result in a system or a part of a system failing. Some electronic systems include components that are configured to protect circuits from damage from ESD events (e.g., from a voltage spike that may occur at input terminals of an electronic system due to static discharge from a human body or other object). For example, an ESD clamp device may be provided to discharge a high voltage that may occur during an ESD event. An appropriate ESD clamp control circuit, or trigger circuit, may be provided to cause the ESD clamp device to turn on (become conductive) to discharge a high voltage (ESD voltage) that occurs during ESD conditions without unnecessarily discharging lower voltages (e.g., a supply voltage that is within a specified range) that may occur under non-ESD conditions. For example, a supply voltage may be provided at less than 2.0 volts while an ESD voltage may be in the range of 1000 volts). An ESD clamp control circuit may maintain an ESD clamp device in an off (non-conductive) state while the supply voltage is relatively low (e.g., below or near 2.0 volts) without significant current leakage, and may turn the ESD clamp device on (conductive) when the supply voltage is high (e.g., above a predetermined voltage).

One or more ESD clamp devices and associated ESD clamp control circuits may be provided in an electronic system. For example, in a memory system, ESD clamp devices and associated ESD clamp control circuits may be provided on memory and/or controller dies. For example, controller 102 may include one or more ESD clamp devices and associated ESD clamp control circuit connected to an input from host 120 and/or memory packages 104 may each include ESD clamp devices and associated ESD clamp control circuits. ESD clamp devices and associated ESD clamp control circuits may be considered part of power control circuits 316 and may be located on a memory die (e.g., memory die 300 shown in FIG. 2A) or a control die (e.g., control die 311 shown in FIG. 2B).

Figure 4:
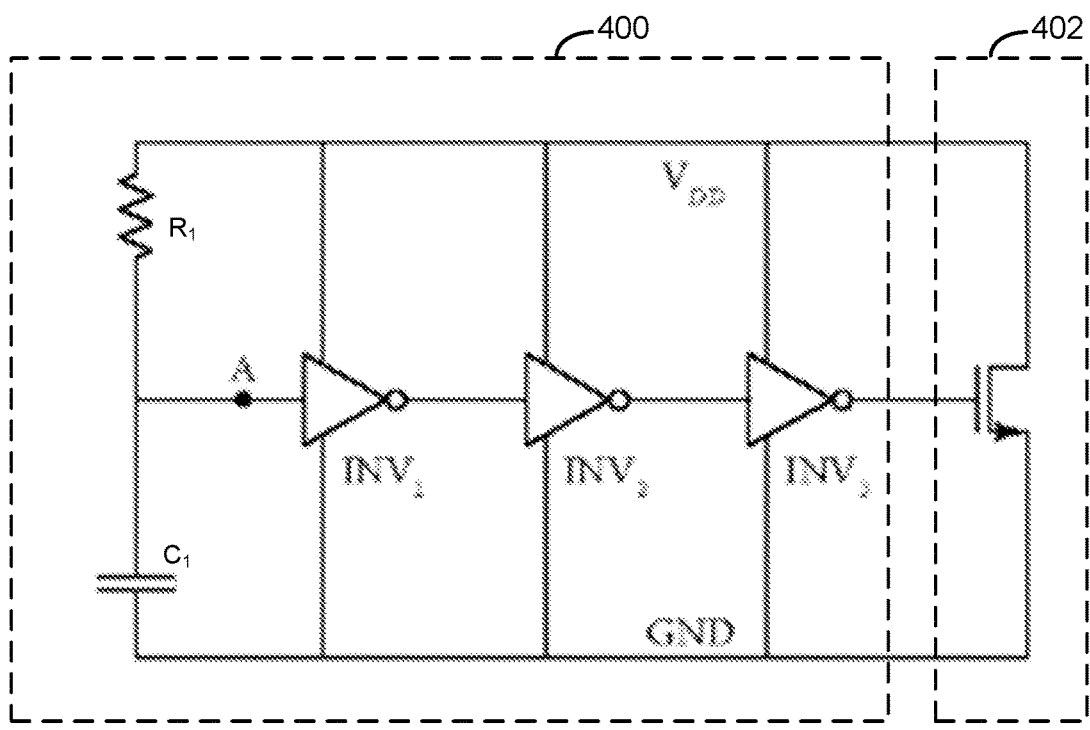
FIG. 4 shows an example of an ESD clamp device controlled by an ESD clamp control circuit.

FIG. 4 shows an example of an ESD clamp control circuit 400 connected to an ESD clamp device 402, which is connected between two input terminals (rails), a power input terminal ($V_{DD}$) and a ground input terminal (GND). During non-ESD conditions, ESD clamp device 402 is nonconducting (turned off) so that little or no current flows through ESD clamp device 402 during normal operation. When an ESD event occurs and the voltage difference between the $V_{DD}$ terminal and ground is high, ESD clamp control circuit 400 triggers ESD clamp device 402, causing it to turn on and discharge the ESD voltage.

ESD clamp control circuit 400 includes a Resistor-Capacitor (RC) delay portion formed by resistor R1 connected in series with capacitor C1. This provides a delayed input voltage to node A, the input terminal of a first inverter, INV1. First inverter $INV_1$ is one of three inverters ($INV_1$, $INV_2$ and $INV_3$) in an inverter chain. The inverters are connected in series in this example so that the output of $INV_1$ is provided to $INV_2$ and the output of $INV_2$ is provided to $INV_3$, which controls ESD clamp device 402. In non-ESD conditions (e.g., when the voltage difference between the $V_{DD}$ and GND terminals is within a specified range), the inverter chain ($INV_1$, $INV_2$ and $INV_3$) provides an output to ESD clamp device 402 to ensure that ESD clamp device 402 remains off (non-conductive). During an ESD event (e.g., when a high voltage exists between the $V_{DD}$ and GND terminals), the inverter chain ($INV_1$, $INV_2$ and $INV_3$) provides an output to ESD clamp device 402 to turn on ESD clamp device 402. For example, in FIG. 4, ESD clamp device 402 is implemented by a Field Effect Transistor (FET), which may be turned on (made conductive) by an appropriate voltage from the inverter chain ($INV_1$, $INV_2$ and $INV_3$). The RC delay portion formed by R1 and C1 in combination with the inverter chain ($INV_1$, $INV_2$ and $INV_3$) provides a delay in subsequently turning off ESD clamp device 402 so that ESD clamp device 402 remains on long enough to adequately discharge the $V_{DD}$ terminal.

While the ESD clamp control circuit 400 may operate effectively under some conditions, there are challenges to using such a circuit in some cases. For example, such a circuit may only work with a supply voltage ($V_{DD}$) that is within a relatively narrow range. This may cause problems when the supply voltage changes from product to product and/or different supply voltages are provided to a product. In some cases, lower supply voltages are used to enable higher interface speeds. For example, in some NAND memory systems, supply voltages of 1.2-1.8 volts have been used with relatively low data rates (e.g., less than 4 Gbps) while lower supply voltages (e.g., a supply voltage less than 0.8 volts such as 0.55 volts, 0.6 volts, 0.7 volts or other voltage between 0.5 volts and 0.8 volts) may be used to facilitate higher data rates (e.g., 4.8 Gbps). However, when a low supply voltage is used, the digital logic of the inverter chain ($INV_1$, $INV_2$ and $INV_3$) may be affected. For example, the threshold voltages of transistors in inverter chain ($INV_1$, $INV_2$ and $INV_3$) may be higher than the supply voltage, which may increase the probability of a crowbar current and may cause false triggering of the ESD clamp device (e.g., ESD clamp device 402 may be turned on under non-ESD conditions). While an inverter chain may be designed to have transistors with relatively low threshold voltages (e.g., less than the supply voltage, which may be in the range of 0.5 volts to 0.8 volts), inverters formed by such transistors may experience significant leakage currents when supply voltage is higher (e.g., inverters designed to operate with a supply voltage of 0.55 volts may have significant leakage current when used with a supply voltage of 1.3 volts).

Aspects of the present technology are directed to adaptable ESD trigger circuits (clamp control circuits) that are adaptable to work with a wide range of supply voltages including relatively low voltages (e.g., in the range of 0.5 volts to 0.8 volts) and higher voltages (e.g., in the range of 1.0 volt to 2.0 volts) without significant leakage currents. Such an adaptable ESD trigger circuits may enable a common ESD trigger circuit design to be used across a range of products that are compatible with different supply voltages and/or enable a common ESD trigger circuit design to be used for all supply voltages in a product that receives multiple supply voltages (e.g., a relatively high supply voltage in the range of 1-2 volts and a relatively low supply voltage in the range of 0.5-0.8 volts).

Figure 5A:
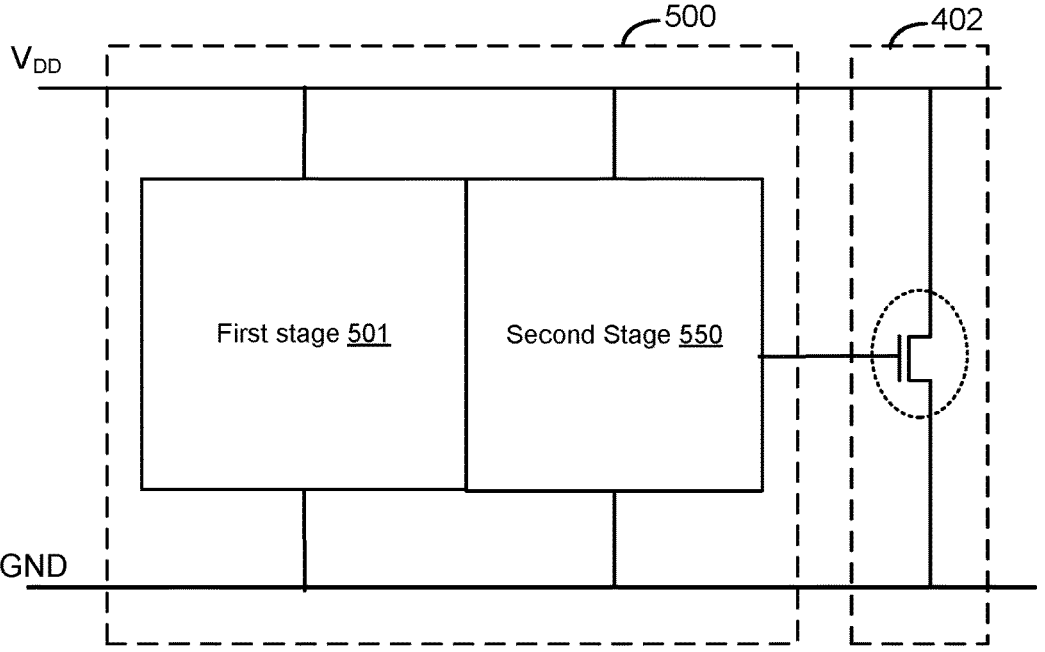
FIG. 5A shows an example of an ESD clamp control circuit that includes a first stage and a second stage.

FIG. 5A shows an example of an ESD clamp control circuit 500 according to an example of the present technology. ESD clamp control circuit 500 includes a first stage 501 and a second stage 550 (in other examples an ESD clamp control circuit may be implemented by a single stage or more than two stages). An output from second stage 550 controls ESD clamp device 402 (e.g., controlling the voltage at the gate of a FET as previously described).

Figures 5B, 5C:
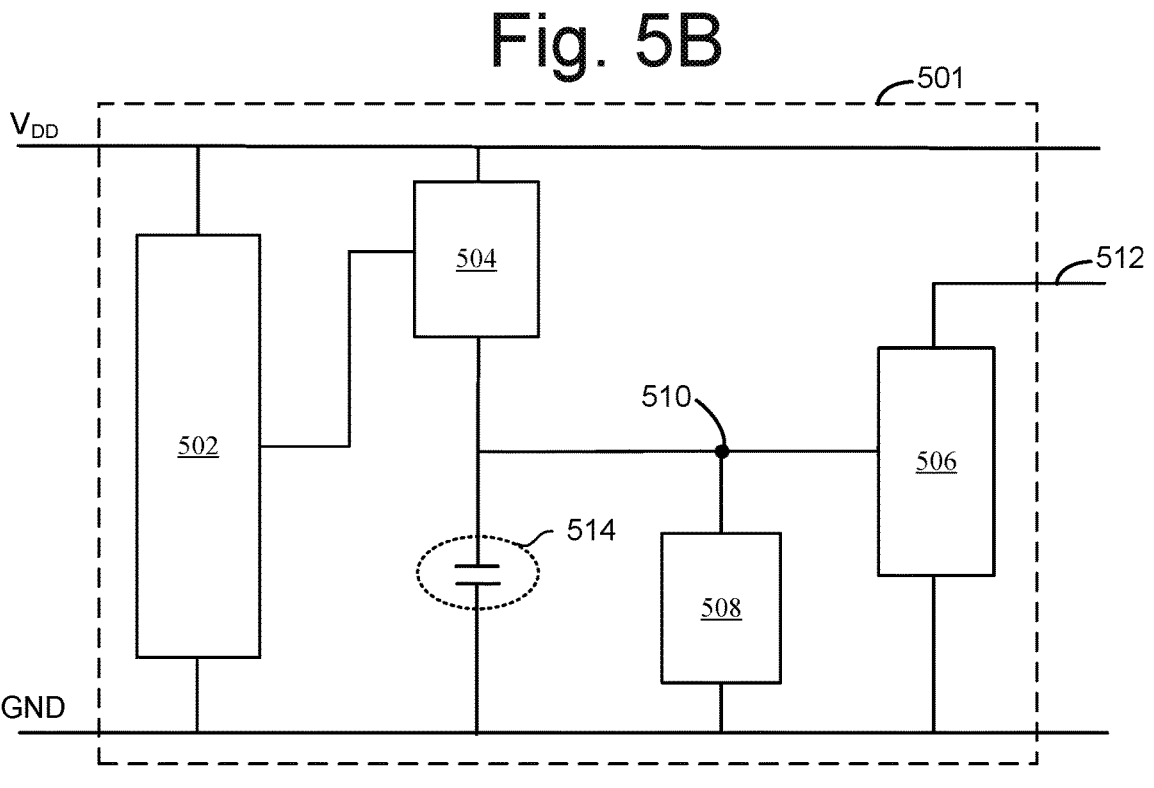
FIG. 5B shows an example of a first stage of an ESD clamp control circuit.
FIG. 5C shows an example implementation of a first stage of an ESD clamp control circuit.

FIG. 5B shows an example of first stage 501 of First stage 501 according to an example of the present technology. First stage 501 includes an RC delay portion 502, a pull-up device 504, a pull-down device 506 and a discharge pathway 508. The RC delay portion 502 is configured to control the pull-up device 504 (e.g., an input from RC delay portion 502 is provided to control pull-up device 504 by turning it on/off). Pull-up device 504 is connected to a control node 510 of the pull-down device 506 to control pull-down device 506. Pull-down device 506 is configured to control the ESD clamp device (e.g., directly or indirectly). Discharge pathway 508 is connected to control node 510 of pull-down device 506 to discharge control node 510 in non-ESD conditions (e.g., to prevent voltage at control node 510 from rising and causing pull-down device 506 turning on). A capacitor 514 is connected in parallel with discharge pathway 508. The combination of discharge pathway 508 and capacitor 514 may control the voltage of control node 510 (e.g., controlling timing of a voltage drop at the end of, or after occurrence of an ESD event such that the ESD clamp device remains on long enough to adequately discharge the voltage between $V_{DD}$ and GND).

FIG. 5C shows an example implementation of first stage 501 (first stage 501 may also be implemented in other ways). In the example of FIG. 5C, RC delay portion 502 is implemented by resistor 520 connected in series with capacitor 522 between $V_{DD}$ and GND terminals so that voltage at an output node 524 of RC delay portion 502 generally follows voltage at terminal $V_{DD}$ with some delay and a control signal (e.g., to turn off an ESD clamp device) is delayed. For example, resistor 520 may be a fifty kiloohm (50 kΩ) resistor and capacitor 522 may be a five picofarad (5 pF) capacitor. Pull-up device 504 is implemented by a transistor 526 that is connected between $V_{DD}$ and (through capacitor 514) GND. The control node (e.g., gate) of transistor 526 is connected to output node 524 of RC delay portion 502 so that transistor 526 is turned on by an increased voltage from output node 524, which tends to cause an increase in voltage at control node 510 (e.g., voltage of control node 510 is pulled up by turning transistor 526 on). Pull-down device 506 is implemented by a transistor 528, which has a gate connected to control node 510 so that transistor 528 is turned on/off by voltage of control node 510. Increased voltage at control node 510 may turn on transistor 528. In an example, transistor 526 is a PMOS transistor and transistor 528 is an NMOS transistor. Transistor 528 controls output 512, which may be used to control an ESD clamp device (e.g., ESD clamp device 402).

Figure 6A:
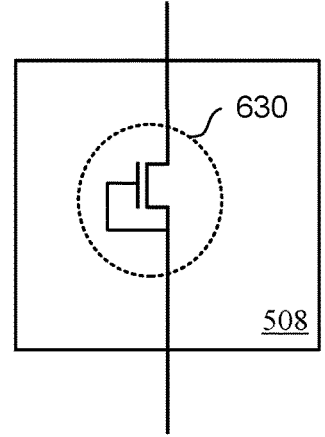
FIGS. 6A-B show examples of discharge pathways that may be used in ESD clamp control circuits.
Figure 6B:
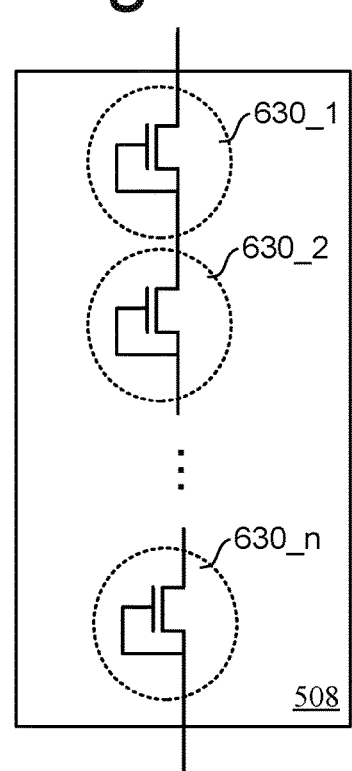

Discharge pathway 508 may be configured to discharge control node 510 to maintain control node 510 at a relatively low voltage during non-ESD operation (e.g., operation when no ESD event takes place and voltage on the $V_{DD}$ terminal remains within a specified voltage range) and to enable voltage of control node 510 to rise during an ESD event (e.g., discharge by discharge pathway 508 is overcome by a relatively large current through pull-up device 504 during an ESD event). A discharge pathway such as discharge pathway 508 may be implemented in different ways according to examples of the present technology. FIGS. 6A-B show two examples but the present technology is not limited to such examples.

FIG. 6A shows an example of discharge pathway 508 implemented by a depletion-mode MOS device 630 (e.g., a device that has a negative threshold voltage such that the device is conductive even without applying a voltage to its gate) that has its source connected to its gate, which is connected to ground. MOS device 630 may have a relatively high impedance so that the current flowing through MOS device 630 may be relatively small (e.g., saturation current of MOS device 630 may be configured at an appropriate level to maintain control node 510 at a low voltage during non-ESD operation and allow the voltage of control node 510 to rise during an ESD event).

FIG. 6B shows an example of discharge pathway 508 implemented by a chain of depletion-mode MOS device 630_1 to 630_n. Each MOS device 630_1 to 630_n may be a depletion-mode MOS device (e.g., a device having a negative threshold voltage such that the device is conductive even without applying a voltage to its gate) that has its gate connected to ground as previously described with respect to MOS device 630. Series-connected MOS devices 630_1 to 630_n may have a relatively high impedance so that the current flowing through MOS devices 630_1 to 630_n may be relatively small such that MOS devices 630_1 to 630_n help to stabilize voltage of control node 510 during non-ESD operation and do not intervene during ESD events). The number of depletion-mode MOS devices connected in series to form a discharge pathway (e.g., the value of n) may be selected to provide a desired impedance.

Figure 7:
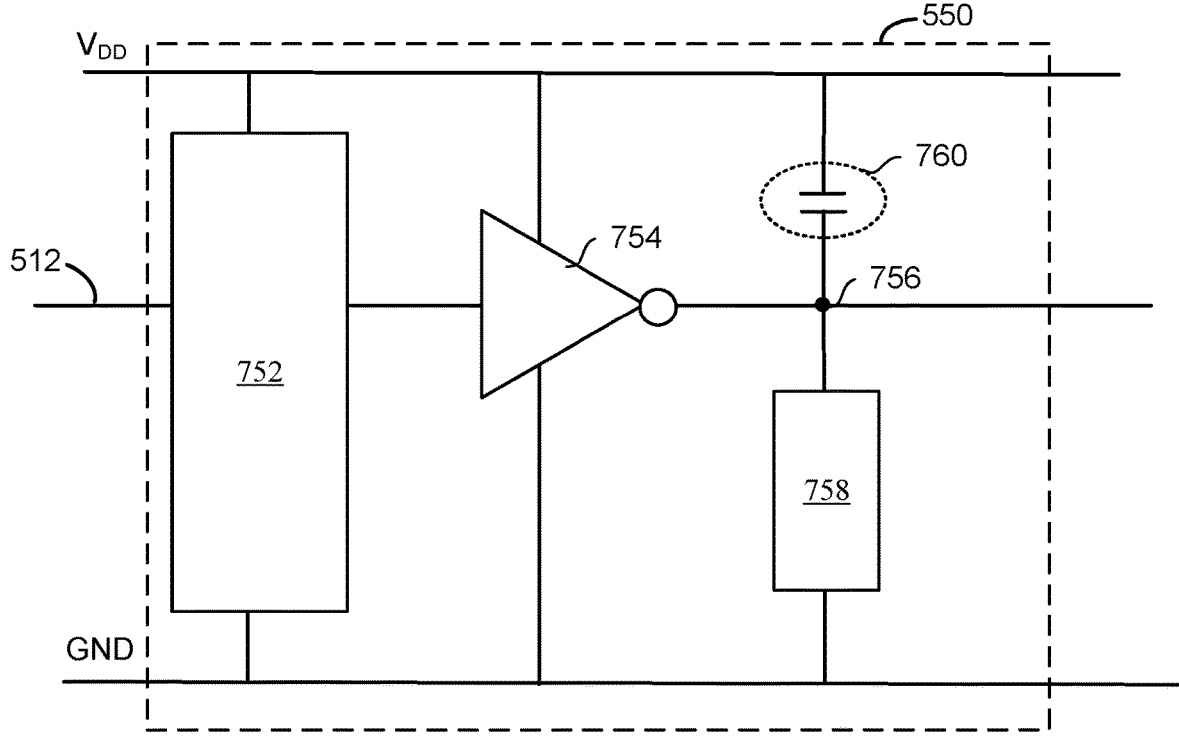
FIG. 7 shows an example of a second stage of an ESD clamp control circuit.

FIG. 7 shows an example implementation of second stage 550, which includes an RC delay portion 752 (second RC delay portion) and an inverter portion 754 that has its output connected to the output node 756 of second stage 550. Output 512 of first stage 501 is connected as an input to second stage 550 (connected to RC delay portion 752). Second stage 550 also includes discharge pathway 758 (second discharge pathway) between output node 756 and GND and a bypass capacitor 760 between the $V_{DD}$ terminal and output node 756.

Figure 8:
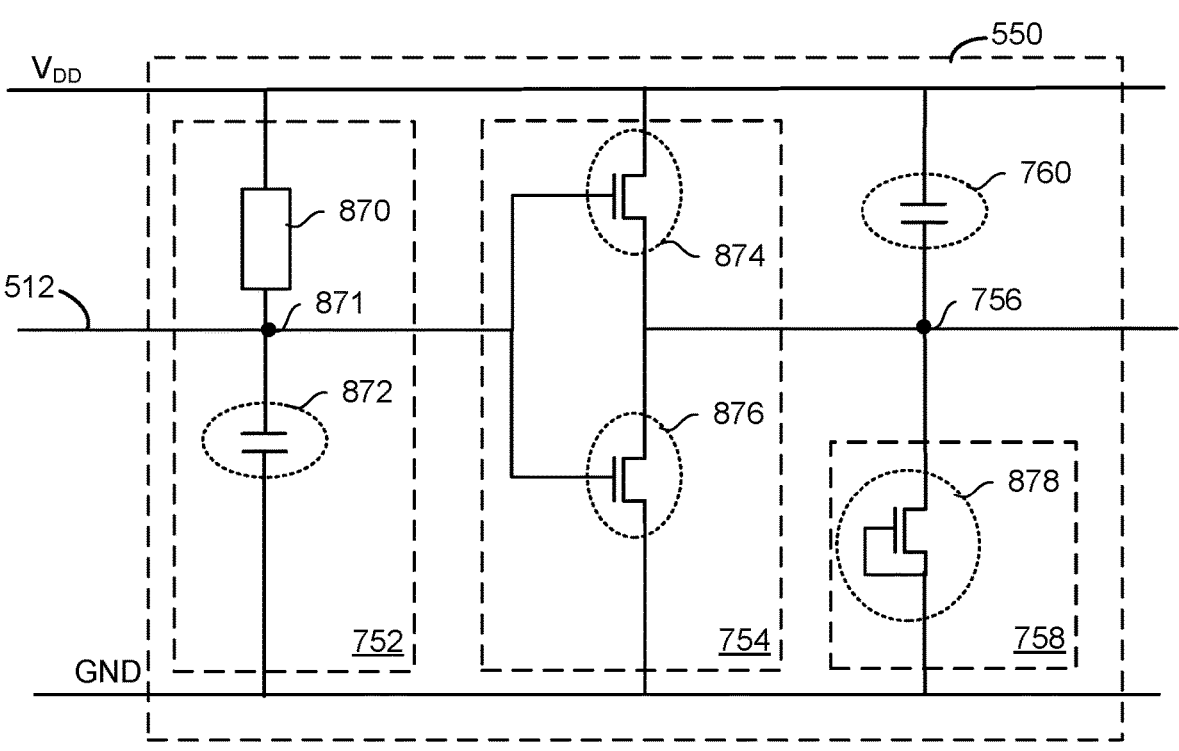
FIG. 8 shows an example implementation of a second stage of an ESD clamp control circuit.

FIG. 8 shows an example implementation of second stage 550 in more detail. RC delay portion 752 is implemented by resistor 870 connected in series with capacitor 872 between $V_{DD}$ and GND with output 512 of first stage 501 connected to node 871, which is between resistor 870 and capacitor 872. RC delay portion 752 may provide additional delay (in addition to stage 1 delay) to ensure full discharge of an ESD voltage. In an example, resistor 870 is a twenty kiloohm (20 kΩ) resistor and capacitor 872 is a five picofarad (5 pF) capacitor.

Inverter portion 754 is implemented by transistor 874 and transistor 876, which are connected in series between $V_{DD}$ and GND and have their gates connected together in an inverter arrangement (e.g., output voltage is the inverse of input voltage so that when the input voltage at node 871 is low, the output voltage at output node 756 is high and vice versa). For example, transistor 874 may be a PMOS transistor and transistor 876 may be an NMOS transistor. Inverter portion 754 may cause the voltage at output node 756 to be inverted with respect to the voltage at node 871 (e.g., as the voltage at node 871 drops because of pull-down device 506 of first stage 501, the voltage at output node 756 rises, which may turn on an ESD clamp device).

Discharge pathway 758 is implemented by a depletion-mode MOS transistor 878, which may be similar to depletion-mode MOS transistor 630 (e.g., as illustrated in FIG.

6A). Alternatively, discharge pathway 758 may be implemented by a chain of series-connected depletion-mode MOS transistors (e.g., as shown in FIG. 6B).

Bypass capacitor 760 ("gate kick capacitor") is connected directly between the $V_{DD}$ terminal and output node 756. This allows a high voltage to bypass first stage 501, RC delay portion 752 and inverter portion 754 to cause a rapid increase in voltage at output node 756 when an ESD event occurs so that an ESD clamp device is turned on rapidly. Subsequently, the delays provided by first stage 501, RC delay portion 752 and inverter portion 754 ensure that the voltage at output node 756 remains high long enough to ensure discharge of the ESD voltage (e.g., ensuring that the ESD clamp device remains on until the voltage at the $V_{DD}$ terminal returns to a specified range for $V_{DD}$). For example, bypass capacitor 760 may be a five picofarad (5 pF) capacitor.

While FIGS. 5A-8 show an example of the present technology that uses two stages, either stage may be used alone or with one or more additional stages in an ESD clamp control circuit and the present technology is not limited to any particular arrangement of one or more stages.

Figure 9:
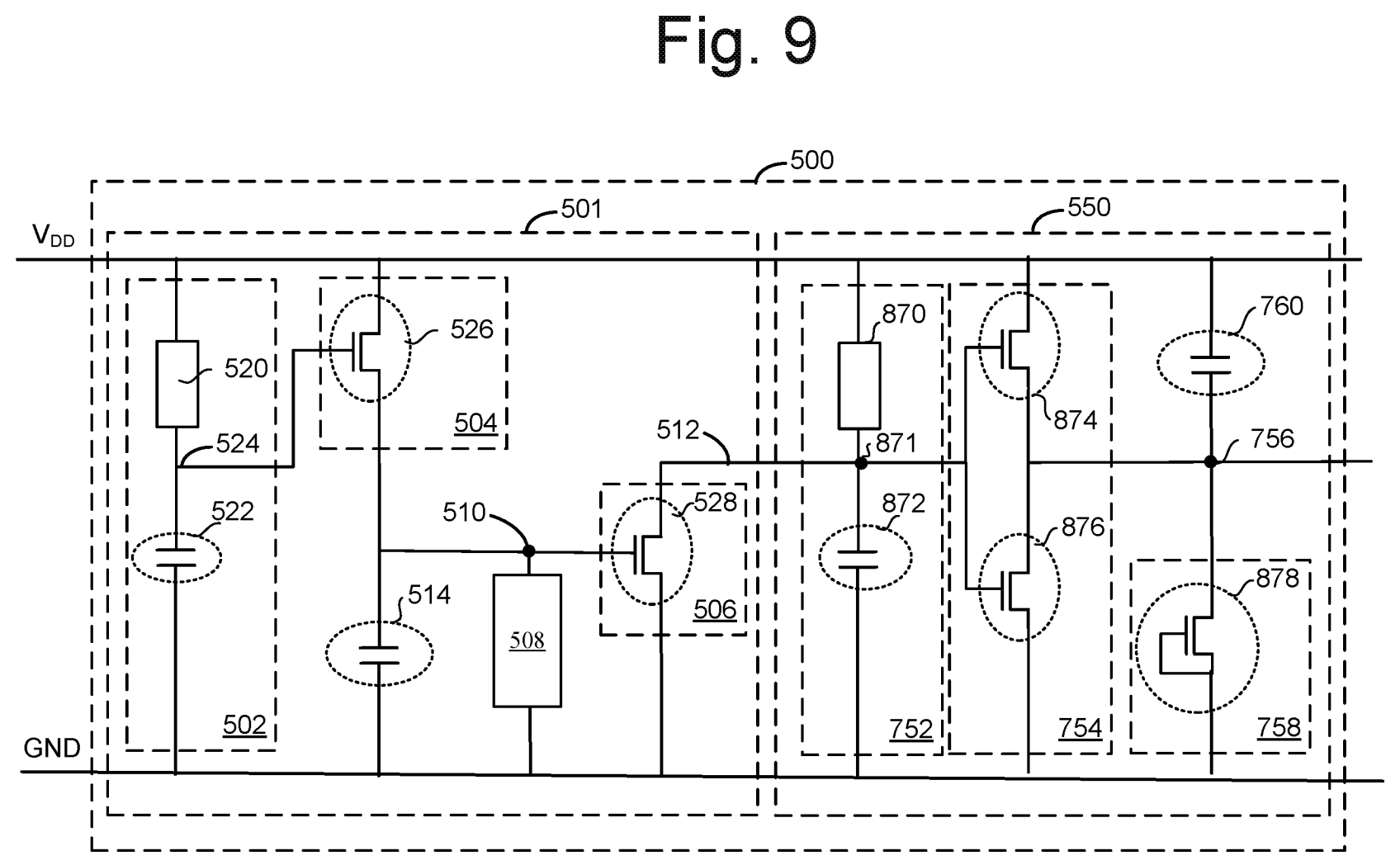

FIG. 9 shows an example of ESD clamp control circuit 500 including first stage 501 (implemented as illustrated in the example shown in FIG. 5C) and second stage 550 (implemented as illustrated in the example shown in FIG. 8). Operation of ESD clamp control circuit 500 will now be described with respect to FIG. 9. ESD clamp control circuit 500 may be considered as an example of a means for controlling an ESD clamp device by discharging a node (e.g., control node 510) under non-ESD conditions to maintain the node in a first voltage range and by enabling voltage at the node to rise to a second voltage range under ESD conditions.

An RC delay network is formed by RC delay portion 502 and RC delay portion 752, which are implemented in a manner such that second stage 550 turns ON after a delay caused by first stage 501. An example sequence during an ESD event is as follows: PMOS transistor 526 turns on, which causes NMOS transistor 528 to turn on, causing PMOS transistor 874 to turn on causing the voltage at output node 756 to go high (e.g., turning on an ESD clamp device).

Delay in first stage 501 (e.g., because of RC delay portion 502) ensures that output node 756 (which controls the ESD clamp device) is ON for enough time to discharge the ESD event. One or more depletion-mode NMOS (e.g., with negative Vt) device in discharge pathway 508 is used in conjunction with capacitor 514 to control voltage at control node 510 (e.g., to control falling voltage after voltage spike during ESD event). Discharge pathway 508 (e.g., implemented by a depletion-mode NMOS stack) may act to pull down the voltage at control node 510 during ramp up of non-ESD voltage (e.g., ramp up of relatively low voltage during normal power on routine) so that voltage at output node 756 remains low and the ESD clamp device is not triggered. The depletion-mode transistor(s) of discharge pathway 508 may be configured to sink a sufficient current during a power-up routine to ensure that the voltage at control node 510 remains low and NMOS transistor 528 remains off, which keeps output node 765 low, while the current sunk is not significant during an ESD event so that voltage at control node 510 rises and turns on NMOS transistor 528, causing voltage at output node 756 to rise, which triggers the ESD clamp device. RC delay portion 752 in second stage 550 acts as additional protection to ensure that the ESD clamp device remains on long enough to enable sufficient ESD voltage dissipation. Voltage pull-down in second stage 550 is ensured by discharge pathway 758, implemented by depletion-mode MOS transistor 878. Bypass capacitor 760 operates during an ESD event by coupling output node 756 to the high voltage on the $V_{DD}$ rail thereby ensuring a rapid response to a transient voltage.

Figure 10:
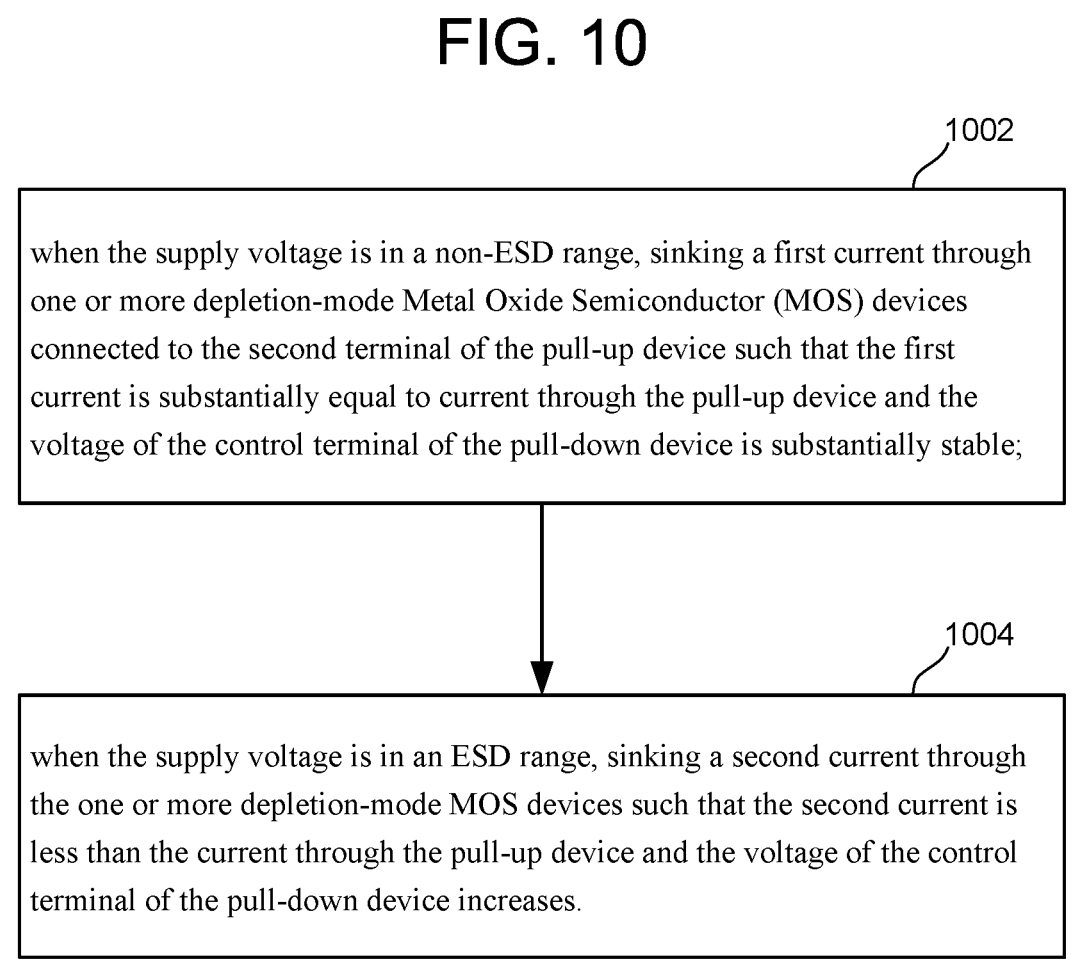

FIG. 10 illustrates a method that may be implemented using any suitable ESD clamp control circuit described above (e.g., ESD clamp control circuit 500 of FIG. 9). The method may be implemented in an ESD clamp control circuit that includes a pull-up device having a first terminal connected to a supply voltage and a second terminal connected to a control node of a pull-down device that controls switching of the clamp control circuit. The method includes: when the supply voltage is in a non-ESD range, sinking a first current through one or more depletion-mode Metal Oxide Semiconductor (MOS) devices connected to the second terminal of the pull-up device such that the first current is substantially equal to current through the pull-up device and the voltage of the control terminal of the pull-down device is substantially stable 1002 (e.g., one or more depletion-mode MOS devices of discharge pathway 508 sinking a first current from control node 510 that is substantially equal to a current passing through PMOS transistor 526 so that control node 510 remains at a relatively low voltage). The method further includes, when the supply voltage is in an ESD range, sinking a second current through the one or more depletion-mode MOS devices such that the second current is less than the current through the pull-up device and the voltage of the control terminal of the pull-down device increases.

Figure 11:
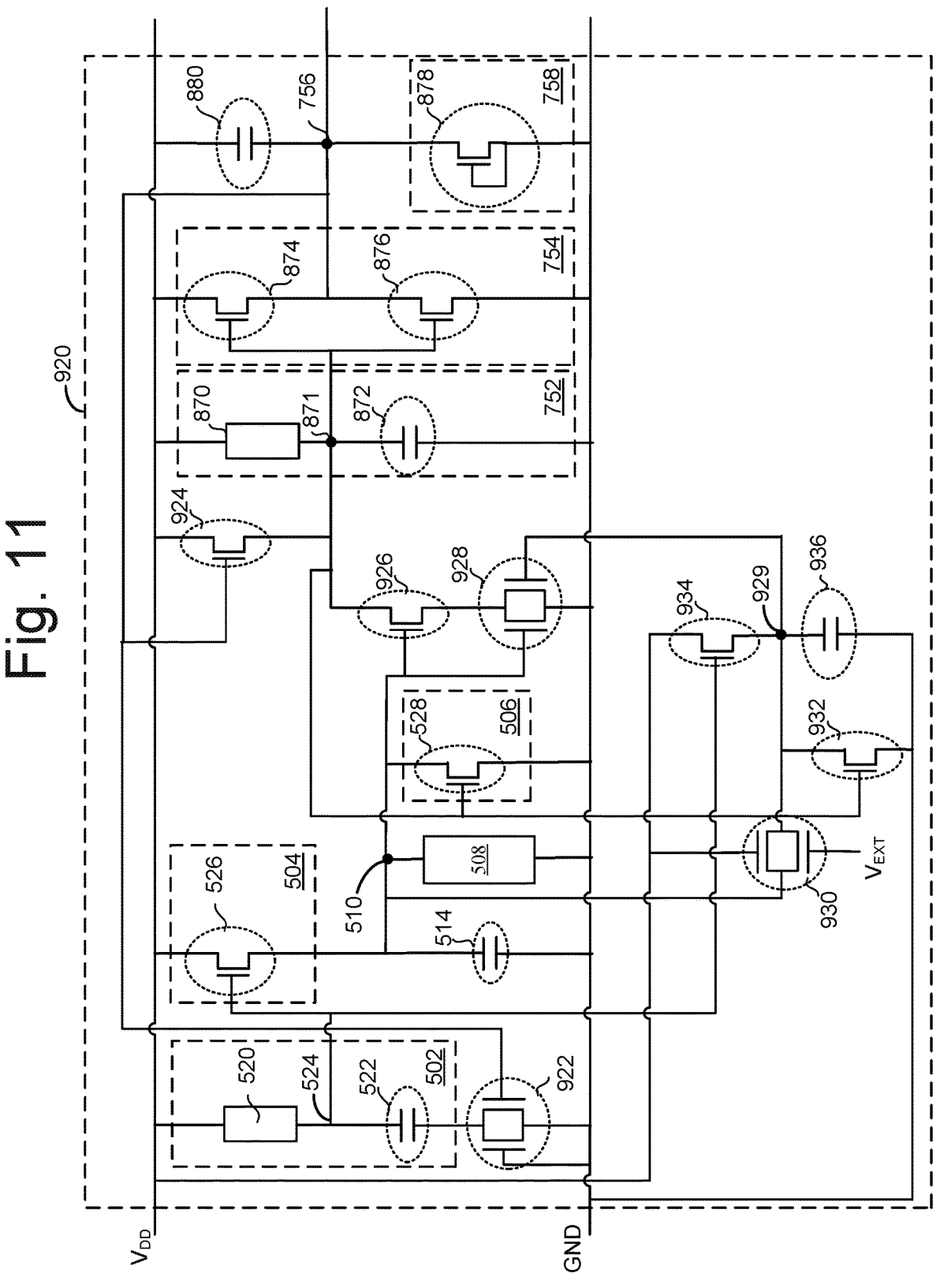
FIG. 11 shows an example implementation of an ESD clamp control circuit that includes a first stage and a second stage.

Aspects of the present technology may include variations on and/or additions to the circuits above. FIG. 11 shows an example of an ESD clamp control circuit 920 that includes many of the same components as ESD clamp control circuit 500 as illustrated in FIG. 9 in combination with additional components. Similar components are similarly numbered and may function in a similar way. Description of such components and their function is not repeated here. ESD clamp control circuit 920 may be considered as an example of a means for controlling an ESD clamp device by discharging a node (e.g., control node 510) under non-ESD conditions to maintain the node in a first voltage range and by enabling voltage at the node to rise to a second voltage range under ESD conditions.

Additional components (compared with ESD clamp control circuit 500) include a pair of parallel-connected devices 922 in series with RC delay portion 502, with one device having its control gate connected to GND and the other having its control gate connected to output node 756. FIG. 11 also shows additional device 924, which is connected between $V_{DD}$ and node 871, with its control gate connected to output node 756. Additional device 926 and a pair of parallel-connected devices 928 are connected in series between node 871 and GND, with the control gate of device 926 and a first control gate of devices 928 connected to control node 510. The control gate of the second device of devices 928 is connected to additional node 929. A pair of parallel-connected devices 930 are connected between control node 510 and additional node 929. The control gates of one device of devices 930 is connected to $V_{DD}$ while the other is connected to $V_{EXT}$, which may be a supply voltage that is equal or higher than $V_{DD}$. For example, where $V_{DD}$ is supplied at a low voltage (e.g., 0.6 volts) to support high interface speeds, $V_{EXT}$ may be at some higher voltage (e.g., 1.2 volts). For lower interface speeds, $V_{DD}$ may be higher (e.g., more than 0.6 volts) and in some cases the voltage at $V_{DD}$ and $V_{EXT}$ may be the same (e.g., the terminals marked $V_{DD}$ and $V_{EXT}$ may be directly connected). Additional device 932 connects additional node 929 to GND and has a control gate connected to node 871. Device 934 and capacitor 936 are connected in series between $V_{DD}$ and GND, with additional node 929 between them and with the control gate of device 934 connected to output node 524. The inclusion of additional node 929 and associated components may introduce an additional delay in the transition of node 871 to HIGH, thereby ensuring sufficient time to discharge an ESD voltage.

An example apparatus includes one or more circuits configured to control an Electrostatic Discharge (ESD) clamp device. The one or more circuits include a Resistor-Capacitor (RC) delay portion, a pull-up device, a pull-down device and a discharge pathway. The RC delay portion is configured to control the pull-up device, the pull-up device is connected to a control node of the pull-down device to control the pull-down device. The pull-down device is configured to control the ESD clamp device and the discharge pathway is connected to the control node of the pull-down device to discharge the control node in non-ESD conditions.

The discharge pathway may include a depletion-mode Metal Oxide Semiconductor (MOS) device. The discharge pathway may include a plurality of depletion-mode MOS devices connected in series. The RC delay portion may include a resistor connected in series with a capacitor, the resistor and the capacitor connected to a control node of the pull-up device such that an ESD voltage across the resistor and the capacitor in series causes an increase in voltage of the control node that turns on the pull-up device. The pull-up device may be connected to the control node of the pull-down device such that turning ON the pull-up device enables the pull-down device to be ON. The discharge pathway may be connected to the control node of the pull-down device to sink the pull-up device current in non-ESD conditions. The discharge pathway may have an impedance configured to enable the discharge pathway and ensures the control node of the pull-down device remains low during non-ESD conditions. The impedance may be configured such that during an ESD event, when there is significant current through the pull-up device, the discharge pathway does not sink a significant portion of the pull-up device current and the voltage of the control node of the pull-down device increases, which turns on the pull-down device. The RC delay portion, the pull-up device, the pull-down device and the discharge pathway may be in a first stage of an ESD clamp control circuit, the pull-down device may be configured to provide an output of the first stage, the ESD clamp control circuit may further include a second stage between the output of the first stage and the ESD clamp device and the second stage may include an inverter portion such that an output of the second stage is an inverse of the output of the first stage. The second stage may further include one or more depletion-mode MOS devices connected to the output of the inverter portion to discharge the output of the inverter portion in non-ESD conditions. The second stage may further include a bypass capacitor, a first electrode of the bypass capacitor connected to an input terminal of the ESD clamp control circuit and a second electrode of the bypass capacitor connected to the output of the second stage. The apparatus may further include a second RC delay portion in the second stage, the second RC delay portion including a resistor connected in series with a capacitor, the resistor and the capacitor connected to an input of the inverter portion. The apparatus may further include at least one additional node that is connected to a first input terminal by an additional transistor and is connected to a second input terminal by an additional capacitor, a control gate of the additional transistor is connected to the output of the second stage.

An example of a method implemented in an Electrostatic Discharge (ESD) clamp control circuit that includes a pull-up device having a first terminal connected to a supply voltage and a second terminal connected to a control node of a pull-down device that controls switching of the clamp control circuit includes, when the supply voltage is in a non-ESD range, sinking a first current through one or more depletion-mode Metal Oxide Semiconductor (MOS) devices connected to the second terminal of the pull-up device such that the first current is substantially equal to current through the pull-up device and voltage of the control node of the pull-down device is substantially stable; and when the supply voltage is in an ESD range, sinking a second current through the one or more depletion-mode MOS devices such that the second current is less than the current through the pull-up device and the voltage of the control terminal of the pull-down device increases.

The method may further include delaying a control signal to the pull-up device through a Resistor Capacitor (RC) delay portion. The method may further include inverting the output of the pull-down device to generate a control signal to control the ESD clamp.

An example of a data storage system includes a plurality of nonvolatile memory cells; one or more control circuits connected to the plurality of nonvolatile memory cells, the one or more control circuits having a power input terminal; an Electrostatic Discharge (ESD) clamp device connected to the power input terminal to discharge an ESD voltage on the power input terminal; and means for controlling the ESD clamp device by discharging a node under non-ESD conditions to maintain the node in a first voltage range and by enabling voltage at the node to rise to a second voltage range under ESD conditions.

The plurality of nonvolatile memory cells may be located on a memory die and the one or more control circuits, the ESD clamp device and the means for controlling the ESD clamp device are located on a control die. The power input terminal may be configured to receive a power input at a supply voltage that is less than 0.8 volts. The ESD conditions may include a voltage of more than 300 volts at the power input terminal.

The foregoing detailed description has been presented for purposes of illustration and description. It is not intended to be exhaustive or to limit the invention to the precise form disclosed. Many modifications and variations are possible in light of the above teachings. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. An apparatus comprising:
   one or more circuits configured to control an Electrostatic Discharge (ESD) clamp device, the one or more circuits including a Resistor-Capacitor (RC) delay portion, a pull-up device, a pull-down device, a capacitor and a discharge pathway, the RC delay portion is configured to control the pull-up device, the pull-up device is connected to a control node of the pull-down device to control the pull-down device, the pull-down device is configured to control the ESD clamp device, the capacitor is connected between the control node of the pull-down device and ground and the discharge pathway is connected in parallel with the capacitor between the control node of the pull-down device and ground, the discharge pathway is formed of one or more depletion-mode devices configured to discharge the control node in non-ESD conditions, each depletion-mode device having a negative threshold voltage.

2. The apparatus of claim 1, wherein one or more depletion-mode devices of the discharge pathway includes a depletion-mode Metal Oxide Semiconductor (MOS) device that has a source and a gate that are connected to ground.

3. The apparatus of claim 1, wherein the discharge pathway includes a plurality of depletion-mode MOS devices connected in series, each depletion-mode MOS device having a source connected directly to a gate.

4. The apparatus of claim 1, wherein the RC delay portion includes a resistor connected in series with a capacitor, the resistor and the capacitor connected to a control node of the pull-up device such that an ESD voltage across the resistor and the capacitor in series causes an increase in voltage of the control node that turns on the pull-up device.

5. The apparatus of claim 4, wherein the pull-up device is connected to the control node of the pull-down device such that turning on the pull-up device causes the pull-down device to turn on.

6. The apparatus of claim 1, wherein the discharge pathway has an impedance configured to enable the discharge pathway to pull-down voltage of the control node such that voltage of the control node of the pull-down device remains low during non-ESD conditions without significantly affecting voltage of the control node during ESD conditions.

7. The apparatus of claim 6, wherein the impedance is configured such that during an ESD event, the pull-up current is unaffected by the discharge pathway, the discharge pathway does not sink the pull-up device current and the voltage of the control node of the pull-down device increases.

8. The apparatus of claim 1, wherein the RC delay portion, the pull-up device, the pull-down device and the discharge pathway are in a first stage of an ESD clamp control circuit, the pull-down device is configured to provide an output of the first stage, the ESD clamp control circuit further includes a second stage between the output of the first stage and the ESD clamp device and the second stage includes an inverter portion such that an output of the second stage is an inverse of the output of the first stage.

9. The apparatus of claim 8, wherein the second stage further includes one or more depletion-mode MOS devices connected to the output of the inverter portion to discharge the output of the inverter portion in non-ESD conditions.

10. The apparatus of claim 8, wherein the second stage further includes a bypass capacitor, a first electrode of the bypass capacitor connected to an input terminal of the ESD clamp control circuit and a second electrode of the bypass capacitor connected to the output of the second stage.

11. The apparatus of claim 8, further comprising a second RC delay portion in the second stage, the second RC delay portion including a resistor connected in series with a capacitor, the resistor and the capacitor connected to an input of the inverter portion.

12. The apparatus of claim 8, further comprising at least one additional node that is connected to a first input terminal by an additional transistor and is connected to a second input terminal by an additional capacitor, a control gate of the additional transistor is connected to the output of the second stage.

13. A method implemented in an Electrostatic Discharge (ESD) clamp control circuit that includes a pull-up device having a first terminal connected to a supply voltage and a second terminal connected to a control node of a pull-down device that controls switching of the clamp control circuit, the method comprising:

when the supply voltage is in a non-ESD range and the pull-up device is off, sinking a first current through one or more depletion-mode Metal Oxide Semiconductor (MOS) devices connected to the control node of the pull-down device to ensure that the voltage of the control node of the pull-down device is substantially stable, each depletion-mode MOS device having a negative threshold voltage; and when the supply voltage is in an ESD range, sinking a second current through the one or more depletion-mode MOS devices such that the second current is less than a current through the pull-up device and the voltage of the control node of the pull-down device increases, the second current is the saturation current of the one or more depletion-mode MOS devices.

14. The method of claim 13, further comprising delaying a control signal to the pull-up device through a Resistor Capacitor (RC) delay portion.

15. The method of claim 14, further comprising inverting an output of the pull-down device to generate a control signal to control the ESD clamp.

16. A data storage system comprising:

a plurality of nonvolatile memory cells;

one or more control circuits connected to the plurality of nonvolatile memory cells, the one or more control circuits having a power input terminal;

an Electrostatic Discharge (ESD) clamp device connected to the power input terminal to discharge an ESD voltage on the power input terminal; and means for controlling the ESD clamp device by discharging a node under non-ESD conditions through a depletion-mode transistor that has a negative threshold voltage and has a gate connected to a source to maintain the node in a first voltage range and by enabling voltage at the node to rise to a second voltage range under ESD conditions.

17. The data storage system of claim 16, wherein the plurality of nonvolatile memory cells are located on a memory die and the one or more control circuits, the ESD clamp device and the means for controlling the ESD clamp device are located on a control die.

18. The data storage system of claim 17, wherein the power input terminal is configured to receive a power input at a supply voltage that is less than 0.8 volts.

19. The data storage system of claim 18, wherein the ESD conditions include a voltage of more than 300 volts at the power input terminal.

20. The data storage system of claim 16, wherein the means for controlling the ESD clamp device by discharging the node is in a first stage of an ESD clamp control circuit, the ESD clamp control circuit further includes a second stage between an output of the first stage and the ESD clamp device and the second stage includes an inverter portion such that an output of the second stage is an inverse of the output of the first stage, the data storage system further includes at least one additional node that is connected to a first input terminal by an additional transistor and is connected to a second input terminal by an additional capacitor, a control gate of the additional transistor is connected to the output of the second stage.

* * * * *